(12) United States Patent
Salkie (10) Patent No.: US 11,733,278 B2
(45) Date of Patent: Aug. 22, 2023

(54) CONDUCTIVITY MEASUREMENT DEVICE (71) Applicant: JENARIAH, LLC, Greenbelt, MD (US)

(72) Inventor: Philip Salkie, Philadelphia, PA (US)

(73) Assignee: JENARIAH, LLC, Greenbelt, MD (US)

( * ) Notice: Subject to any disclaimer, the term of this patent is extended or adjusted under 35 U.S.C. 154(b) by 256 days.

(21) Appl. No.: 17/142,965

(22) Filed: Jan. 6, 2021

(65) Prior Publication Data
US 2022/0065908 A1 Mar. 3, 2022

Related U.S. Application Data (60) Provisional application No. 63/071,064, filed on Aug. 27, 2020.

(51) Int. Cl.
*G01R 27/02* (2006.01)
*G01N 27/06* (2006.01)
*G01N 27/07* (2006.01)

(52) U.S. Cl.
CPC ............ *G01R 27/02* (2013.01); *G01N 27/06* (2013.01); *G01N 27/07* (2013.01)

(58) Field of Classification Search
CPC ........ G01R 27/02; G01R 27/22; G01N 27/06; G01N 27/07
See application file for complete search history.

(56) References Cited

U.S. PATENT DOCUMENTS

| 4,126,857 A | 11/1978 | Lancia et al. |
| 4,199,323 A | 4/1980 | Miller, Jr. et al. |
| 4,583,402 A | 4/1986 | Myers |
| 5,260,663 A | 11/1993 | Blades |

(Continued)

FOREIGN PATENT DOCUMENTS

EP 2533036 A1 * 12/2012 ............. G01N 27/10

OTHER PUBLICATIONS

Anonymous. "Thermo Orion STARA1220 Star A122 Portable Conductivity Meter," last viewed on Jul. 22, 2021, available at https://www.hogentogler.com/thermo-orion/stara1220-star-a122-portable-conductivity-meter.asp.

(Continued)

*Primary Examiner* — Amy He
(74) *Attorney, Agent, or Firm* — Maynard Nexsen PC; Brian T. Sattizahn (57) ABSTRACT

In some embodiments, the conductivity measurement device includes a conductivity probe, a solid state switch device, and a DC measurement circuit. The conductivity probe includes a first and second measurement pin used to measure a conductivity of the liquid. The solid state switch device is coupled to the conductivity probe and is configured to connect and disconnect the first measurement pin and second measurement pin to a first DC reference voltage and a second DC reference voltage. The DC measurement circuit is configured to generate a measurement signal such that the measurement signal is maintained at a first DC reference voltage and the first DC reference voltage is applied to the solid state switch device from the DC measurement circuit. In this manner, an alternating current (AC) voltage is applied to the measurement pins utilizing DC reference voltages, which helps to avoid contamination of the liquid.

18 Claims, 8 Drawing Sheets

(56) References Cited

U.S. PATENT DOCUMENTS

| | | | |
|---|---|---|---|
| 5,889,200 | A | 3/1999 | Centers et al. |
| 6,683,535 | B1 | 1/2004 | Utke |
| 2013/0099798 | A1 | 4/2013 | Birecki et al. |
| 2015/0212024 | A1 | 7/2015 | Banks |

OTHER PUBLICATIONS

Anonymous. "750 Series II Resistivity Monitor/Controllers," last viewed on Jul. 22, 2021, available at http://www.myronl.com/products/res_monitors.htm.

Anonymous. "CN0349 Fully Isolated Conductivity Measurement Data Acquisition System" last viewed on Nov. 1, 2021, available at https://www.analog.com/en/design-center/reference-designs/circuits-from-the-lab/CN0349.html.

Anonymous. "CN0411 TDS Measurement System for Water Quality Monitoring" last viewed on Nov. 1, 2021, available at https://www.analog.com/en/design-center/reference-designs/circuits-from-the-lab/CN0411.html#rd-functionbenefits.

Lee, Robert, et al. "Fully Automatic Self-Calibrated Conductivity Measurement System" Analog Dialogue Nov. 2016, pp. 1-6, vol. 50, issue 11.

Druart, Sylvain, et al. "A Self-Oscillating System ti Measure the Cinductivity and the Permittivity of Liquids within a Single Triangular Signal" Journal of Sensors; vol. 2014, Article ID 389764; pp. 1-12, Hindawi Publishing Corporation Feb. 13, 2014.

\* cited by examiner

CONDUCTIVITY MEASUREMENT DEVICE

PRIORITY CLAIM

The instant application is a non-provisional application claiming priority to provisional application No. 63/071,064, filed Aug. 27, 2020, the entire contents of which are incorporated by reference herein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conductivity measurement devices are used to measure the conductivity of a liquid. In some embodiments, the conductivity measurement device includes a conductivity probe, a solid state switch device, and a direct current (DC) measurement circuit. The conductivity probe includes a first measurement pin and a second measurement pin placed in the liquid in order to measure conductivity. The solid state switch device is coupled to the conductivity probe and is configured to connect and disconnect the first measurement pin to a first DC reference voltage and a second DC reference voltage. Additionally, the solid state switch device is configured to connect and disconnect the second measurement pin to the first DC reference voltage and the second DC reference voltage. The DC measurement circuit is configured to generate a measurement signal such that the measurement signal is maintained at a first DC reference voltage. The DC measurement circuit is coupled to the first solid state switch device such that the first DC reference voltage is applied to the solid state switch device from the DC measurement circuit. In this manner, an alternating current (AC) voltage is applied to the measurement pins utilizing DC reference voltages, which helps to avoid contamination of the liquid.

Figure 1:
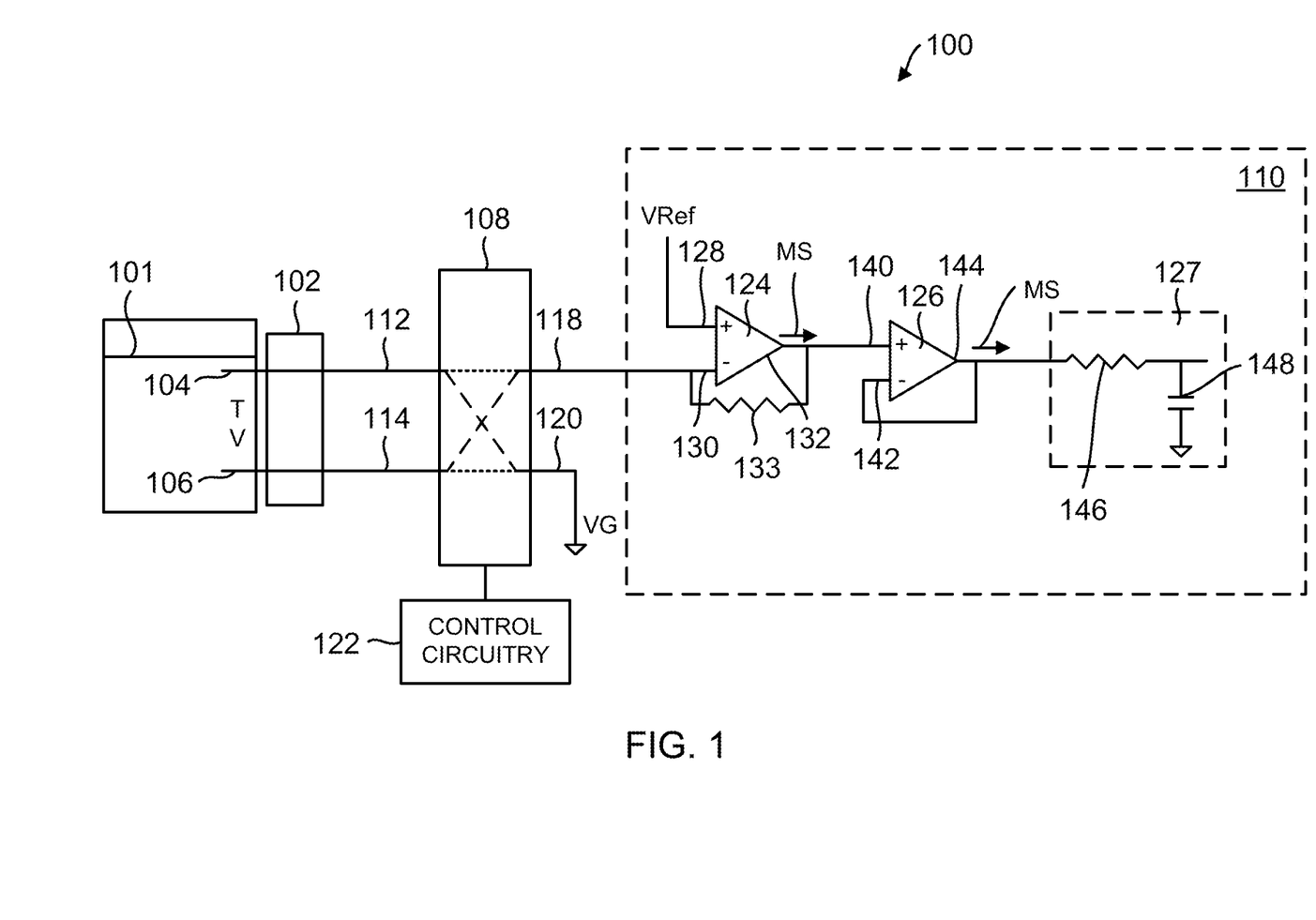
FIG. 1 is a block diagram of an embodiment of a conductivity measurement device.

FIG. 1 is a circuit schematic of an example of a conductivity measurement device 100 for a liquid 101. The conductivity measurement device 100 is configured to measure the conductivity of the liquid 101 and from the measurement determine the purity of the liquid (i.e., degree of contamination of substances in the liquid 101). To make the measurement, the conductivity measurement device 100 includes a conductivity probe 102 having a portion placed in the liquid 101. The conductivity probe 102 may include a first measurement pin 104 and a second measurement pin 106 for placement in the liquid 101. However, any suitable configuration of a conductivity probe 102 may be utilized including conductivity probes with a single pin or with more than two pins. After placement in the liquid 101, the conductivity measurement device 100 generates a test voltage TV across the measurement pins 104, 106. By determining the current across the measurement pins 104, 106 as a result of the test voltage TV, the conductivity of the liquid 101 is measured and thus also the purity of the liquid 101. In other embodiments, other electrical parameters may be detected in order to determine the conductivity of the liquid including a voltage drop, differential measurements, and the like.

To prevent electroplating and to prevent ions from being released from the measurement pins 104, 106 into the liquid 101, the test voltage TV is applied as an AC voltage, such as a sinusoid, square wave, triangular wave, or another cyclical voltage or the like. However, as explained in further detail below, the conductivity measurement device 100 generates the test voltage TV based on a DC voltage, which is a constant voltage other than for noise and variations due to non-ideal circuit behavior.

To generate the test voltage TV, the conductivity measurement device 100 includes a solid state switch device 108 and a DC measurement circuit 110. The solid state switch device may include one or more field effect transistors, bipolar transistors, electromechanical switches, and/or the like. The solid state switch device 108 is coupled to the conductivity probe 102. In this specific embodiment, the solid state switch device 108 is a multi-pole, multi-throw switch. Thus, the solid state switch device 108 has a pole switch terminal 112 connected to the first measurement pin 104 and a pole switch terminal 114 connected to the second measurement pin 106. The solid state switch device 108 is configured to selectively connect and disconnect the pole switch terminals 112, 114 to throw switch terminals 118, 120.

The conductivity measurement device 100 includes control circuitry 122. In some embodiments, control circuitry 122 is optional. The test voltage TV repeats periodically every time cycle. During a first time interval of each time cycle, a DC reference voltage VRef is applied to the first measurement pin 104 and the DC reference voltage, e.g., a ground voltage, is applied to the second measurement pin 106. During a second time interval of each time cycle, a DC reference voltage VRef is applied to the second measurement pin 106 and the DC reference voltage, e.g., a ground voltage, is applied to the first measurement pin 104. The first time interval and the second time interval repeat each time cycle. In some embodiments, the first time interval extends for approximately 50 percent of the time cycle and the second time interval extends for approximately 50 percent of the time cycle. Other embodiments may apply different duty cycles depending on the characteristic of the desired measurement. The control circuitry 122 is configured to selectively connect the first measurement pin 104 to the throw switch terminal 118 while selectively connecting the second measurement pin 106 to the throw switch terminal 120 during a first time interval of a time cycle of the test voltage TV. During a second time interval of the time cycle of the test voltage TV, the control circuitry 122 is configured to selectively connect the second measurement pin 106 to the throw switch terminal 118 while selectively connecting the first measurement pin 104 to the throw switch terminal 120. As explained in further detail below, this results in the test voltage TV being provided to the measurement pins 104, 106 as an AC voltage even though DC voltages are generated by the DC measurement circuit 110. It should be noted that the control circuit 122 may be provided as a general purpose computer implementing software configured to control the solid state switch device 108 and/or as specialized hardware configured to control the solid state switch device 108.

The DC measurement circuit 110 may be configured to generate a measurement signal MS that indicates the conductivity of the liquid 101. In this particular embodiment, the measurement signal MS has a measurement current that varies depending on the conductivity of the liquid 101. However, the DC measurement circuit 110 is configured to generate the measurement signal MS such that the measurement signal MS is maintained at a DC reference voltage VRef. The DC measurement circuit 110 is coupled to the solid state switch device 108 such that the DC reference voltage VRef is applied to the throw switch terminal 118 of the solid state switch device 108. In this manner, whichever one of the pole switch terminals 112, 114 is selectively connected to the pole switch terminal 118 receives the DC reference voltage VRef while the other one of the pole switch terminals 114, 112 is selectively disconnected and does not receive the DC reference voltage VRef. In other embodiments, the measurement signal MS may have a measurement voltage or a differential parameter that varies depending on the conductivity of the liquid 101.

Additionally, the throw switch terminal 120 of the solid state switch device 108 is configured to receive a DC reference voltage VG that is lower than the DC reference voltage VRef. In this particular embodiment, the DC reference voltage VG is a ground voltage. In other embodiments, the DC reference voltage VG may be a negative voltage. By having the throw switch terminal 120 configured to receive the DC reference voltage VG, whichever one of the pole switch terminals 112, 114 is selectively connected to the pole switch terminal 120 receives the DC reference voltage VG. In some embodiments, the first DC reference voltage is the DC reference voltage VRef and the second DC reference voltage is the DC reference voltage VG.

Accordingly, when the control circuitry 122 alternates the selective connection between the pole switch terminals 112, 114 and the throw switch terminals 118, 120, the test voltage TV generates an AC voltage between the measurement pins 104, 106. This allows the conductivity measurement device 100 to maintain a stable voltage into the DC measurement circuit 110, while minimizing the electromagnetic feedback effect that the ultrapure water exhibits and minimizing the amount of material which migrates from the measurement pins 104, 106 into the liquid 101.

In this embodiment, the DC measurement device 110 includes an operational amplifier 124, and an operational amplifier 126, and a resistor capacitor network 127. Other configurations of the DC measurement device 110 may be used. In this embodiment, the operational amplifier 124 has an input terminal 128 (e.g., a non-inverting input terminal), an input terminal 130 (e.g., an inverting input terminal), and an output terminal 132. The input terminal 128 is configured to receive the DC reference voltage VRef. The output terminal 132 is connected as feedback to the input terminal 130. As such, the operational amplifier 124 is configured to generate the measurement signal MS by driving the input terminal 130 to the DC reference voltage VRef. The input terminal 130 of the operational amplifier 124 is connected to the throw switch terminal 118 of the solid state switch device 108. A feedback resistor 133 is coupled as feedback between the output terminal 132 and the input terminal 130 of the operational amplifier 124. The feedback resistor 133 sets the measurable conductivity range of the DC measurement device 110.

In this embodiment, the operational amplifier 124 thus provides a voltage divider circuit where Vout=VRef(1+RF/RC), where RF is the resistance value of the feedback resistor 133 and RC is the resistance value of the liquid 101. Accordingly, the measurement signal MS indicates the conductivity of the liquid while providing an AC signal across the measurement pins 104, 106 with the DC reference voltage VRef. This approach is much less noise prone particularly at the high resistances that may be present if the liquid 101 is water (resistances ranging from 6 Megohms to 18 Megohms).

The operational amplifier 124 is configured to generate the measurement signal MS such that the current of the measurement signal MS varies in accordance with the conductivity of the liquid 101 across the measurement pins 104, 106. The operational amplifier 126 provides an impedance buffer as digital circuitry may have a much lower impedance than the operational amplifier 124. The operational amplifier 126 has an input terminal 140 (e.g., a non-inverting input terminal), an input terminal 142 (e.g., an inverting input terminal), and an output terminal 144. The input terminal 140 of the operational amplifier 126 is connected to the output terminal 132 of the operational amplifier 124. Furthermore, the output terminal 144 of the operational amplifier 126 is coupled as feedback to the input terminal 142 of the operational amplifier 126. The operational amplifier 126 is thus configured to adjust the voltage to current ratio of the measurement signal MS to provide impedance matching.

The resistor capacitor network 127 provides filtering with a time constant that is set in accordance with the time cycles of the test voltage TV. In some embodiments, the time cycles of the test voltage TV are provided to be around 100 milliseconds (ms). In this embodiment, the resistor capacitor network 127 includes a resistor 146 connected in series with the output terminal 144 and a capacitor 148 that is connected in shunt. The DC measurement device 110 allows for measurements to be taken very quickly since the voltages provided are stable and results in a reduced electroplating effect into the liquid 101.

Figure 2A:
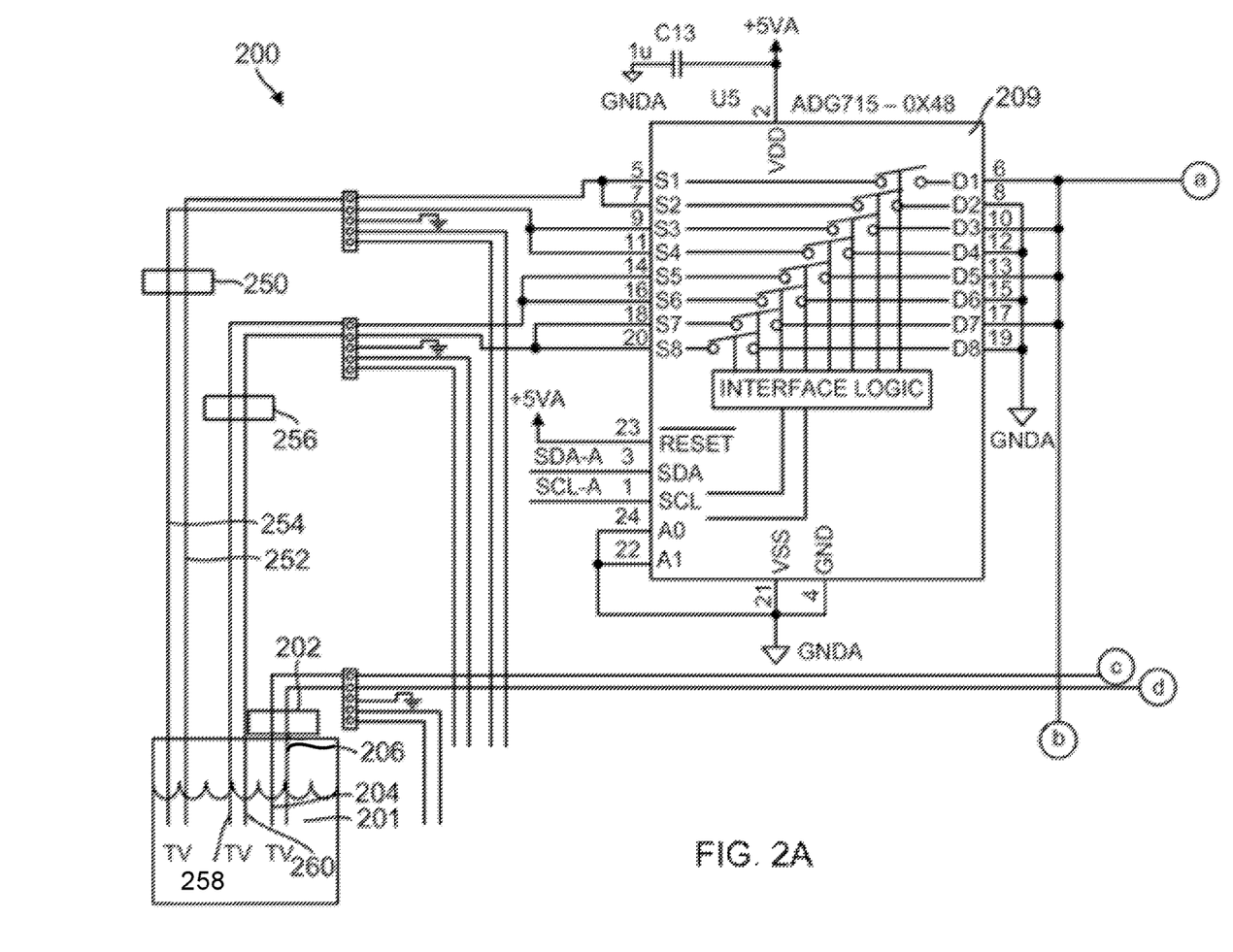
FIGS. 2A-2C are circuit diagrams of an embodiment of a conductivity measurement device.
Figure 2B:
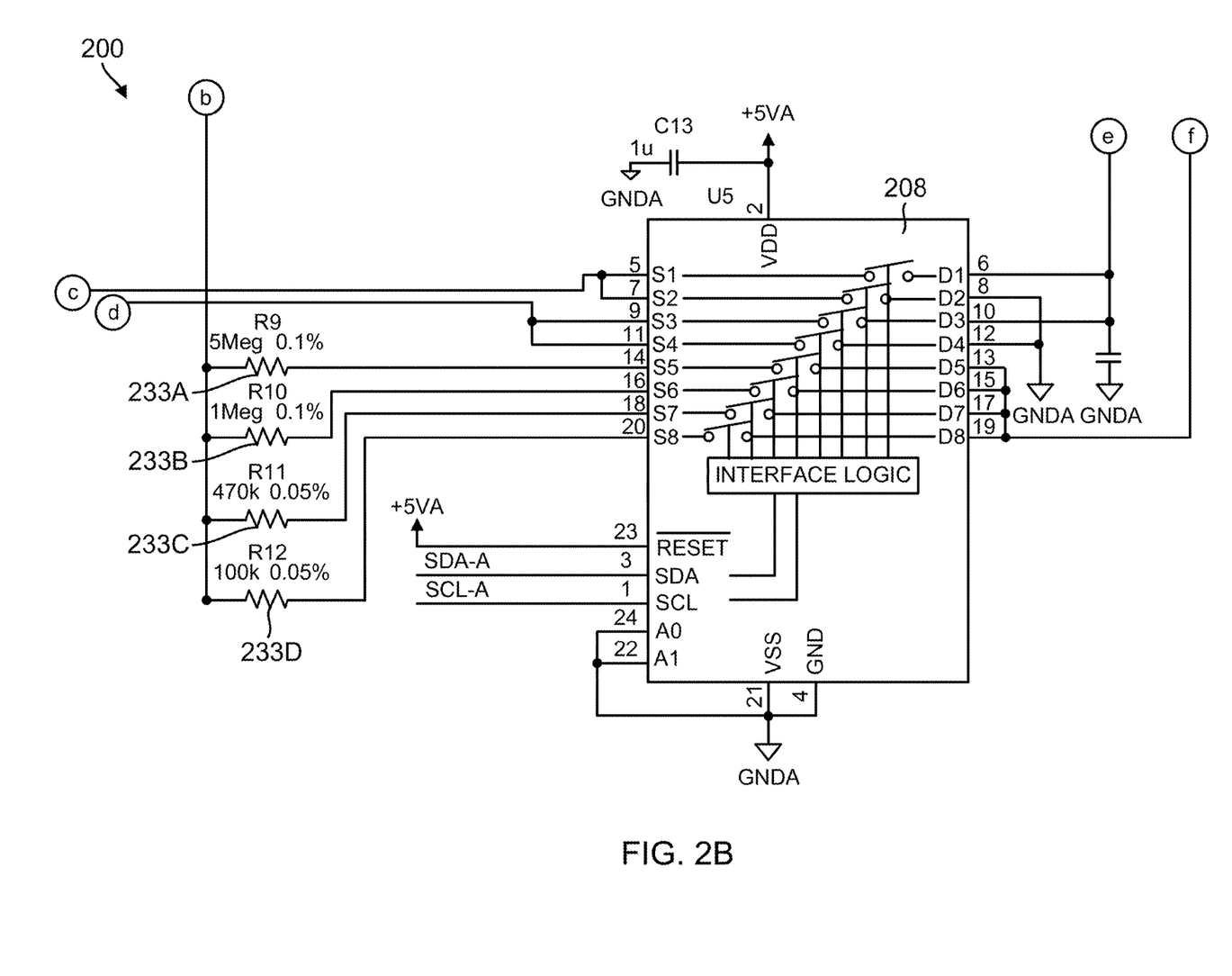
Figure 2C:
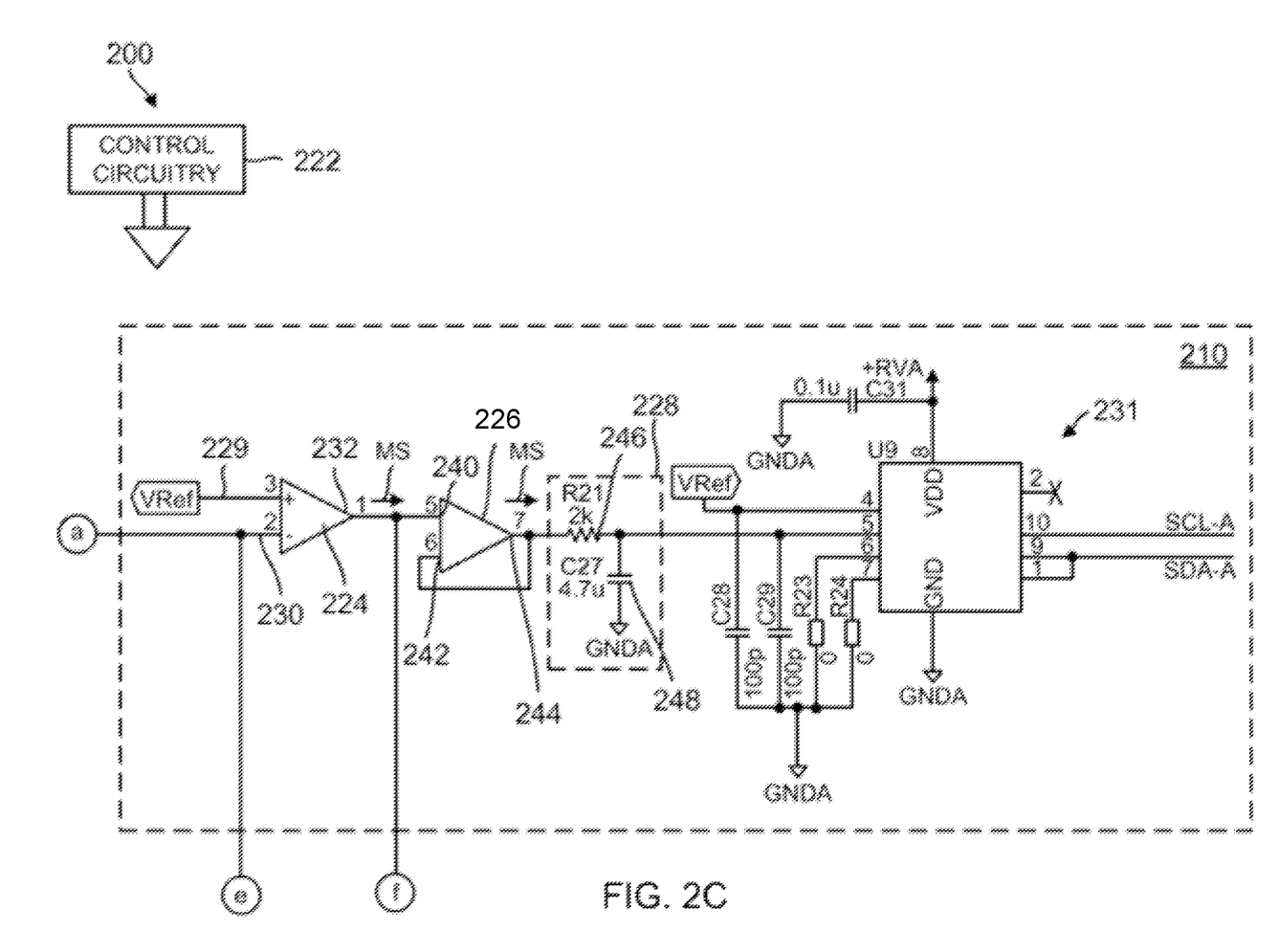

FIG. 2A-FIG. 2C is circuit schematic of an example of a conductivity measurement device 200 for a liquid 201. The conductivity measurement device 200 is configured to measure the conductivity of the liquid 201 and from the measurement determine the purity of the liquid (i.e., degree of contamination of substances in the liquid 201). To make the measurement, the conductivity measurement device 200 includes a conductivity probe 202, a conductivity probe 250, and a conductivity probe 256 that are each placed in the liquid 201. In this embodiment, the conductivity probe 202 includes a first measurement pin 204 and a second measurement pin 206. The second conductivity probe 250 includes a third measurement pin 254 and a fourth measurement pin 252. Finally, the third conductivity probe 256 includes a fifth conductivity pin 258 and a sixth conductivity pin 260. When placed in the liquid 201, the conductivity measurement device 200 is configured to generate a test voltage TV across the measurement pins 204, 206 of the conductivity probe 202, the measurement pins 252, 254 of the conductivity probe 250, and/or the measurement pins 258, 260 of the conductivity probe 256. By determining the current that results across the measurement pins 204, 206, the measurement pins 252, 254, and/or the measurement pins 258, 260 as a result of the test voltage TV, the conductivity of the liquid is measured and thus also the purity of the liquid 201. Other configurations may include any number of conductivity probes less than or more than 3.

To prevent electroplating and to prevent ions from being released from the measurement pins 204, 206, 252, 254, 258, 260, the test voltage TV is applied as an AC voltage, such as a sinusoid, square wave, triangular wave, or another cyclical voltage or the like. However, as explained in further detail below, the conductivity measurement device 200 generates the test voltage TV from a DC voltage, which is a constant voltage other than for noise and variations due to non-ideal circuit behavior.

To generate the test voltage TV, the conductivity measurement device 200 may include a solid state switch device 208 (FIG. 2B), a solid state switch device 209 (FIG. 2A), and a DC measurement circuit 210 (FIG. 2C). The solid state switch device 208 shown in FIG. 2B is coupled to the conductivity probe 202 (shown in FIG. 2A). In this specific embodiment, the solid state switch device 208 has a plurality of single pole single throw (SPST) switches. More specifically, the solid state switch device 208 has a SPST switch between a pole switch terminal S1 and a throw switch terminal D1, a pole switch terminal S2 and a throw switch terminal D2, a pole switch terminal S3 and a throw switch terminal D3, a pole switch terminal S4 and a throw switch terminal D4, a pole switch terminal S5 and a throw switch terminal D5, a pole switch terminal S6 and a throw switch terminal D6, a pole switch terminal S7 and a throw switch terminal D7, and a pole switch terminal S8 and a throw switch terminal D8. The pole switch terminal S1 and the pole switch terminal S2 are connected to the first measurement pin 204. The pole switch terminal S3 and a pole switch terminal S4 are connected to the second measurement pin 206.

In this specific embodiment, the solid state switch device 209 shown in FIG. 2A has a plurality of SPST switches. More specifically, the solid state switch device 209 has a SPST switch between a pole switch terminal S1 and a throw switch terminal D1, a pole switch terminal S2 and a throw switch terminal D2, a pole switch terminal S3 and a throw switch terminal D3, a pole switch terminal S4 and a throw switch terminal D4, a pole switch terminal S5 and a throw switch terminal D5, a pole switch terminal S6 and a throw switch terminal D6, a pole switch terminal S7 and a throw switch terminal D7, and a pole switch terminal S8 and a throw switch terminal D8. The pole switch terminal S1 and the pole switch terminal S2 are connected to the fourth measurement pin 252. The pole switch terminal S3 and a pole switch terminal S4 are connected to the third second measurement pin 254. The pole switch terminal S5 and the pole switch terminal S6 are connected to the fifth measurement pin 258. The pole switch terminal S7 and a pole switch terminal S8 are connected to the sixth measurement pin 260.

In some embodiments, the conductivity measurement device 200 includes control circuitry 222 (shown in FIG. 2C). The control circuitry 222 is configured to selectively connect the first measurement pin 204 to the throw switch terminal D1 of the solid state switch 208 while selectively connecting the second measurement pin 206 to the throw switch terminal D4 of the solid state switch 208 during a first time interval of the test voltage TV. Additionally, during the first time interval of the test voltage TV, the control circuitry 222 is configured to selectively connect the third measurement pin 254 to the throw switch terminal D1 of the solid state switch 209 while selectively connecting the fourth measurement pin 252 to the throw switch terminal D4 of the solid state switch 209. Finally, during the first time interval of the test voltage TV, the control circuitry 222 is configured to selectively connect the fifth measurement pin 258 to the throw switch terminal D5 of the solid state switch 209 while selectively connecting the sixth measurement pin 260 to the throw switch terminal D8 of the solid state switch 209. During a second time interval of the test voltage TV, the control circuitry 222 is configured to selectively connect the first measurement pin 204 to the throw switch terminal D2 of the solid state switch device 208 while selectively connecting the second measurement pin 206 to the throw switch terminal D3 of the solid state switch device 208. Additionally, during the second time interval of the test voltage TV, the control circuitry 222 is configured to selectively connect the third measurement pin 254 to the throw switch terminal D2 of the solid state switch device 209 while selectively connecting the fourth measurement pin 252 to the throw switch terminal D3 of the solid state switch device 209. Finally, during the second time interval of the test voltage TV, the control circuitry 222 is configured to selectively connect the fifth measurement pin 258 to the throw switch terminal D6 of the solid state switch device 209 while selectively connecting the sixth measurement pin 260 to the throw switch terminal D7 of the solid state switch device 209. As explained in further detail below, this results in the test voltage TV being provided to the measurement pins 204, 206 as an AC voltage even though DC voltages are generated by the DC measurement circuit 210. It should be noted that the control circuit 222 may be a general purpose computer implementing software to control the solid state switch device 208 and/or specialized hardware.

The DC measurement circuit 210 shown in FIG. 2C is configured to generate a measurement signal MS that indicates the conductivity of the liquid 201. In this particular embodiment, the measurement signal MS has a measurement current that varies depending on the conductivity of the liquid 201. However, the DC measurement circuit 210 is configured to generate the measurement signal MS such that the measurement signal MS is maintained at a DC reference voltage VRef. The DC measurement circuit 210 is coupled to the solid state switch device 208 such that the DC reference voltage VRef is applied to the throw switch terminals D1, D3 of the solid state switch device 208 and the throw switch terminals D1, D3, D5, D7 of the solid state switch device 209. In this manner, whichever one of the pole switch terminals S1, S3 of the solid state switch device 208 is selectively connected to either the throw switch terminal D1 or the throw switch terminal D3 of the solid state switch device 208 is the terminal that receives the DC reference voltage VRef while the other one of the pole switch terminals S3, S1 is selectively disconnected and does not receive the DC reference voltage VRef. Whichever one of the pole switch terminals S1, S3 of the solid state switch device 209 is selectively connected to either the throw switch terminal D1 or the throw switch terminal D3 of the solid state switch device 209 is the terminal that receives the DC reference voltage VRef. Whichever one of the pole switch terminals S5, S7 of the solid state switch device 209 is selectively connected to either the throw switch terminal D5 or the throw switch terminal D7 of the solid state switch device 209 is the terminal that receives the DC reference voltage VRef.

Additionally, the throw switch terminals D2, D4 of the solid state switch device 208 are configured to receive a DC reference voltage GNA that is lower than the DC reference voltage VRef. In this particular embodiment, the DC reference voltage GNA is a ground voltage. In other embodiments, the DC reference voltage GNA is a negative voltage. By having the throw switch terminals D2, D4 of the solid state switch device 208 configured to receive the DC reference voltage GNA, whichever one of the pole switch terminals S2, S4 of the solid state switch device 208 is selectively connected to the throw switch terminals D2, D4 of the solid state switch device 208 is the terminal that receives the DC reference voltage GNA.

The throw switch terminals D2, D4 of the solid state switch device 208 are configured to receive a DC reference voltage GNA that is lower than the DC reference voltage VRef. In this particular embodiment, the DC reference voltage GNA is a ground voltage. In other embodiments, the DC reference voltage GNA is a negative voltage. By having the throw switch terminals D2, D4 of the solid state switch device 208 configured to receive the DC reference voltage GNA, whichever one of the pole switch terminals S2, S4 of the solid state switch device 208 is selectively connected to the throw switch terminals D2, D4 of the solid state switch device 208 is the terminal that receives the DC reference voltage GNA.

Furthermore, the throw switch terminals D2, D4 of the solid state switch device 209 are configured to receive a DC reference voltage GNA that is lower than the DC reference voltage VRef. In this particular embodiment, the DC reference voltage GNA is a ground voltage. In other embodiments, the DC reference voltage GNA may be a negative voltage. By having the throw switch terminals D2, D4 of the solid state switch device 209 configured to receive the DC reference voltage GNA, whichever one of the pole switch terminals S2, S4 of the solid state switch device 209 is selectively connected to the throw switch terminals D2, D4 of the solid state switch device 209 is the terminal that receives the DC reference voltage GNA.

Additionally, the throw switch terminals D6, D8 of the solid state switch device 209 are configured to receive a DC reference voltage GNA that is lower than the DC reference voltage VRef. In this particular embodiment, the DC reference voltage GNA is a ground voltage. In other embodiments, the DC reference voltage GNA is a negative voltage. By having the throw switch terminals D6, D8 of the solid state switch device 209 configured to receive the DC reference voltage GNA, whichever one of the pole switch terminals S6, S8 of the solid state switch device 209 is selectively connected to the throw switch terminals D6, D8 of the solid state switch device 209 is the terminal that receives the DC reference voltage GNA.

Accordingly, the control circuitry 222 alternates the selective connection between the pole switch terminals S1, S4 and the throw switch terminals D1, D4 of the solid state switch device 208 during one time interval of a time cycle and the pole switch terminals S2, S3 of the solid state switch device 208 and the throw switch terminals D2, D3 of the solid state switch device 208 during another time interval of a time cycle. This results in the test voltage TV being an AC voltage between the measurement pins 204, 206. The control circuitry 222 alternates the selective connection based on a timing configuration. The timing configuration determines the temporal length of each time interval in the time cycle.

Furthermore, the control circuitry 222 alternates the selective connection between the pole switch terminals S1, S4 and the throw switch terminals D1, D4 of the solid state switch device 209 during one time interval of a time cycle and the pole switch terminals S2, S3 of the solid state switch device 209 and the throw switch terminals D2, D3 of the solid state switch device 209 during another time interval of a time cycle. This results in the test voltage TV being an AC voltage between the measurement pins 250, 252.

Finally, the control circuitry 222 alternates the selective connection between the pole switch terminals S5, S8 and the throw switch terminals D5, D8 of the solid state switch device 209 during one time interval of a time cycle and the pole switch terminals S6, S7 of the solid state switch device 209 and the throw switch terminals D6, D7 of the solid state switch device 209 during another time interval of a time cycle. This results in the test voltage TV being an AC voltage between the measurement pins 254, 256.

This allows the conductivity measurement device 200 to maintain a stable voltage into the DC measurement circuit 210, while minimizing the electromagnetic feedback effect that ultrapure water exhibits and minimizing the amount of material which migrates from the measurement pins 204, 206, 252, 254, 258, 260 into the liquid 201. Ultrapure water has a resistance in the range of 18 Megohms/cm at 25 Degrees C.

In this embodiment, the DC measurement device 210 includes an operational amplifier 224, an operational amplifier 226, a resistor capacitor network 228, and an analog to digital converter 231. The operational amplifier 224 has an input terminal 229 (e.g., a non-inverting input terminal), an input terminal 230 (e.g., an inverting input terminal), and an output terminal 232. The input terminal 229 is configured to receive the DC reference voltage VRef. The output terminal 232 is connected as feedback to the input terminal 230. As such, the operational amplifier 224 is configured to generate the measurement signal MS by driving the input terminal 230 to the DC reference voltage VRef. The input terminal 230 of the operational amplifier 224 is connected to the throw switch terminals D1, D3 of the solid state switch device 208 and the throw switch terminals D1, D3, D5, D7 of the solid state switch device 209.

The conductivity measurement device 200 also includes resistors 233A-233D, where each of the resistors 233A-233D has a different resistance value. The output terminal 232 is connected to the throw switch terminals D5-D8 of the solid state switch device 208. Additionally, the resistor 233A is connected to between the pole switch terminal S5 of the solid state switch device 208 and the input terminal 230 of the operational amplifier 224. The resistor 233B is connected between the pole switch terminal S6 of the solid state switch device 208 and the input terminal 230 of the operational amplifier 224. The resistor 233C is connected between the pole switch terminal S7 of the solid state switch device 208 and the input terminal 230 of the operational amplifier 224. The resistor 233D is connected between the pole switch terminal S8 of the solid state switch device 208 and the input terminal 230 of the operational amplifier 224. The solid state switch device 208 is further configured to selectively connect any one of the resistors 233A-233D as feedback between the output terminal 232 and the second input terminal of the operational amplifier 224. In this manner, the solid state switch device 208 allows for the control circuitry 222 to select the measurable conductivity range of the conductivity measurement device 200. In this particular embodiment, the resistor 233A has a resistance value 5 Megohms, the resistor 233B has a resistance value of 1 Megohms, the resistor 233C is 470 kilohms, and the resistor 233D has a resistance value of 100 kilohms.

The operational amplifier 224 thus provides a voltage driver circuit which results in the voltage across the conductivity probe 202 having a magnitude equal to VRef while still providing an AC signal across the measurement pins 204, 206, 252, 254, 258, 260. This approach is much less noise prone particularly at the high resistances that may be present if the liquid 201 is water (resistances between 6 Megohms-18 Megohms).

The operational amplifier 224 is configured to generate the measurement signal MS such that the measurement current of the measurement signal MS varies in accordance with the conductivity of the liquid 201 across the measurement pins 204, 206, the measurement pins 252, 254, and/or the measurement pins 258, 260. The operational amplifier 226 provides an impedance buffer to the digital converter 231 which has a much lower input impedance than the operational amplifier 224. The operational amplifier 226 has an input terminal 240 (e.g., a non-inverting input terminal), an input terminal 242 (e.g., an inverting input terminal), and an output terminal 244. The input terminal 240 of the operational amplifier 226 is connected to the output terminal 232 of the operational amplifier 224. Furthermore, the output terminal 244 of the operational amplifier 226 is coupled as feedback to the input terminal 242 of the operational amplifier 224. The operational amplifier 226 is thus configured to adjust the voltage to current ratio of the measurement signal MS to provide impedance matching.

The resistor capacitor network 228 provides filtering with a time constant set in accordance with the time cycles of the test voltage TV. In some embodiments, the time cycles of the test voltage TV are provided to be around 100 ms. In this embodiment, the resistor capacitor network 228 includes a resistor 246 connected in series with the output terminal 244 and a capacitor 248 that is connected in shunt. In this particular embodiment, the resistor 246 has a resistance value of 2 kilohms and the capacitor has a capacitance value of 4.7 microfarads. The DC measurement device 210 allows for measurements to be taken very quickly since the voltages provided are stable and result in a reduced electroplating effect.

The analog to digital converter 231 is configured to compare the measurement signal to the DC reference voltage VRef so as to generate digital conductivity measurement that identifies the conductivity of the liquid 201. In some embodiments, the analog to digital converter 231 compares VRef to the measurement signal MS and uses ratios to determine the conductivity. This cancels out thermal effects which could cause measurement errors.

Figure 3:
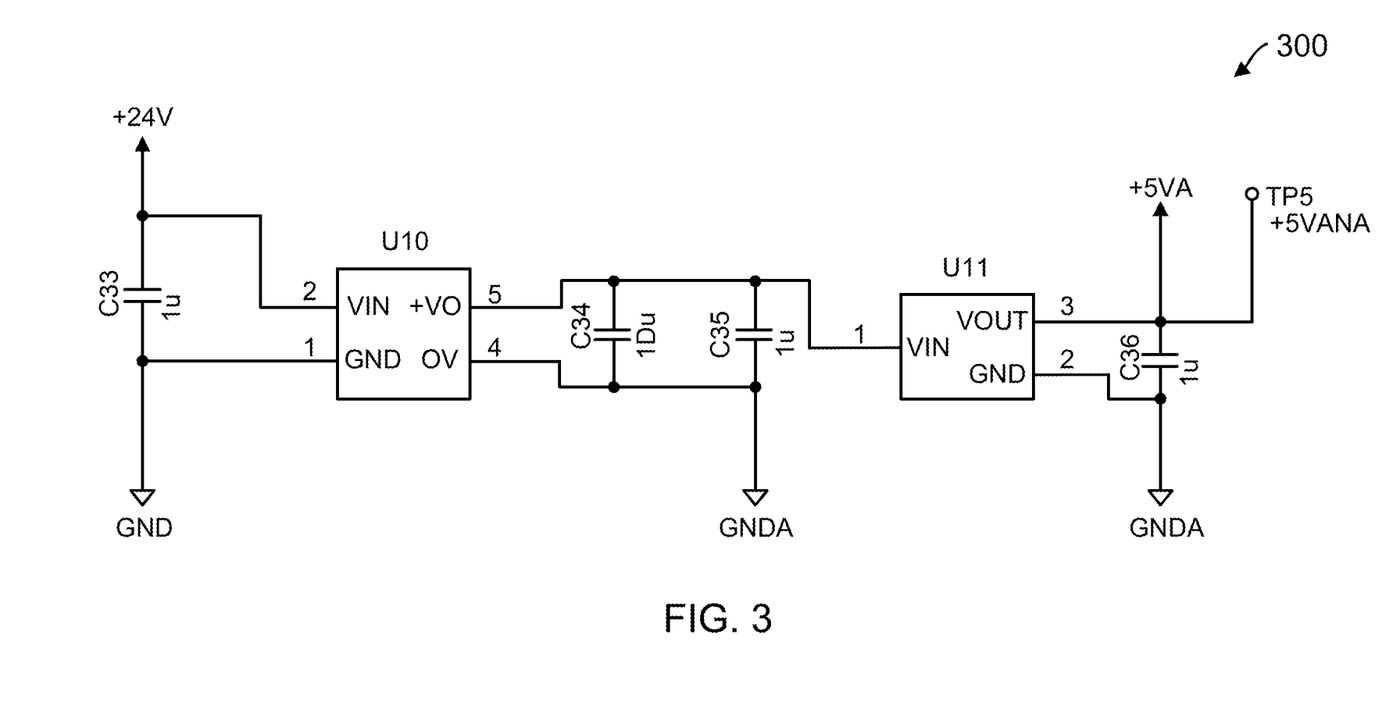
FIG. 3 is a circuit diagram of an embodiment of a voltage isolation circuit.

FIG. 3 is a circuit diagram of an embodiment of a voltage isolation circuit 300. The voltage isolation circuit 300 is configured to generate the power source voltage VDD from a power source that generates a 24 Volt signal. The power source voltage may come from a battery or an AC to DC converter. The voltage isolation circuit 300 isolates the DC reference voltage GND to prevent noise from causing the pins to contaminate the liquid. It should be noted that other configurations of a voltage isolation circuit 300 may be utilized to generate the power source voltage VDD.

Figure 4:
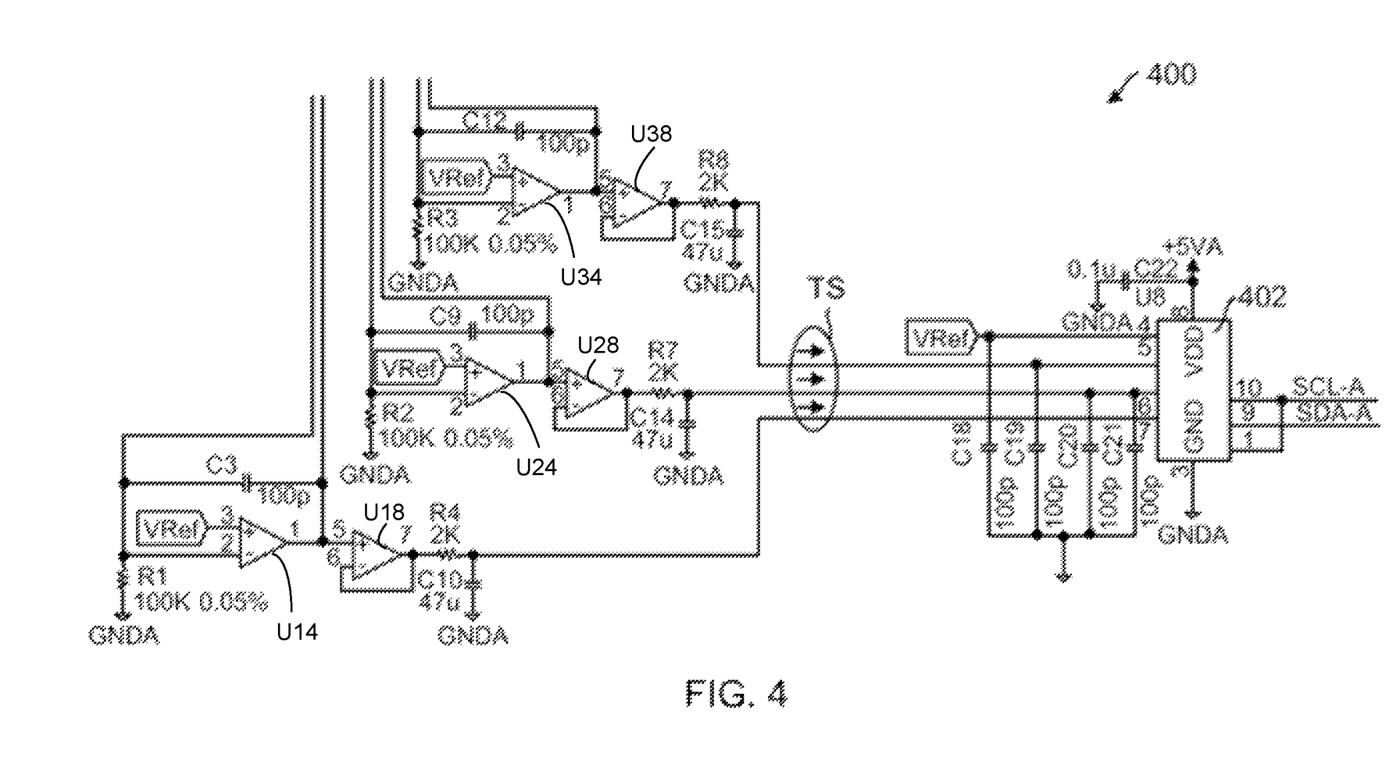
FIG. 4 is a circuit diagram of an embodiment of a temperature measurement circuit.

FIG. 4 is a circuit diagram of an embodiment of a temperature measurement circuit 400. The temperature measurement circuit 400 is configured to generate measurement signals TS that indicate a temperature of the liquid 201. Because conductivity of a liquid, such as water, varies, the control circuit 222 may utilize the measurement signal TS to make an appropriate measurement of the water from the measurement signal MS. The temperature measurement circuit 400 includes three op-amps U34, U24, and U14. The op amp U34 is in an integrator configuration and measures the temperature of the liquid being tested by the conductivity probe 202. A buffer op amp U38 performs impedance matching with a measurement circuit 402. Additionally, the op amp U24 is in an integrator configuration and measures the temperature of the liquid being tested by the conductivity probe 250. A buffer op amp U28 performs impedance matching with a measurement circuit 402. Finally, the op amp U14 is in an integrator configuration and measures the temperature of the liquid being tested by the conductivity probe 256. A buffer op amp U18 performs impedance matching with a measurement circuit 402. The measurement circuit 402 compares the integrated voltage with the reference voltage VRef, which gives a measurement of the temperature. It should be noted that other configurations of the temperature measurement circuit 400 may be utilized in order to measure the temperature of the liquid 201.

Figure 5:
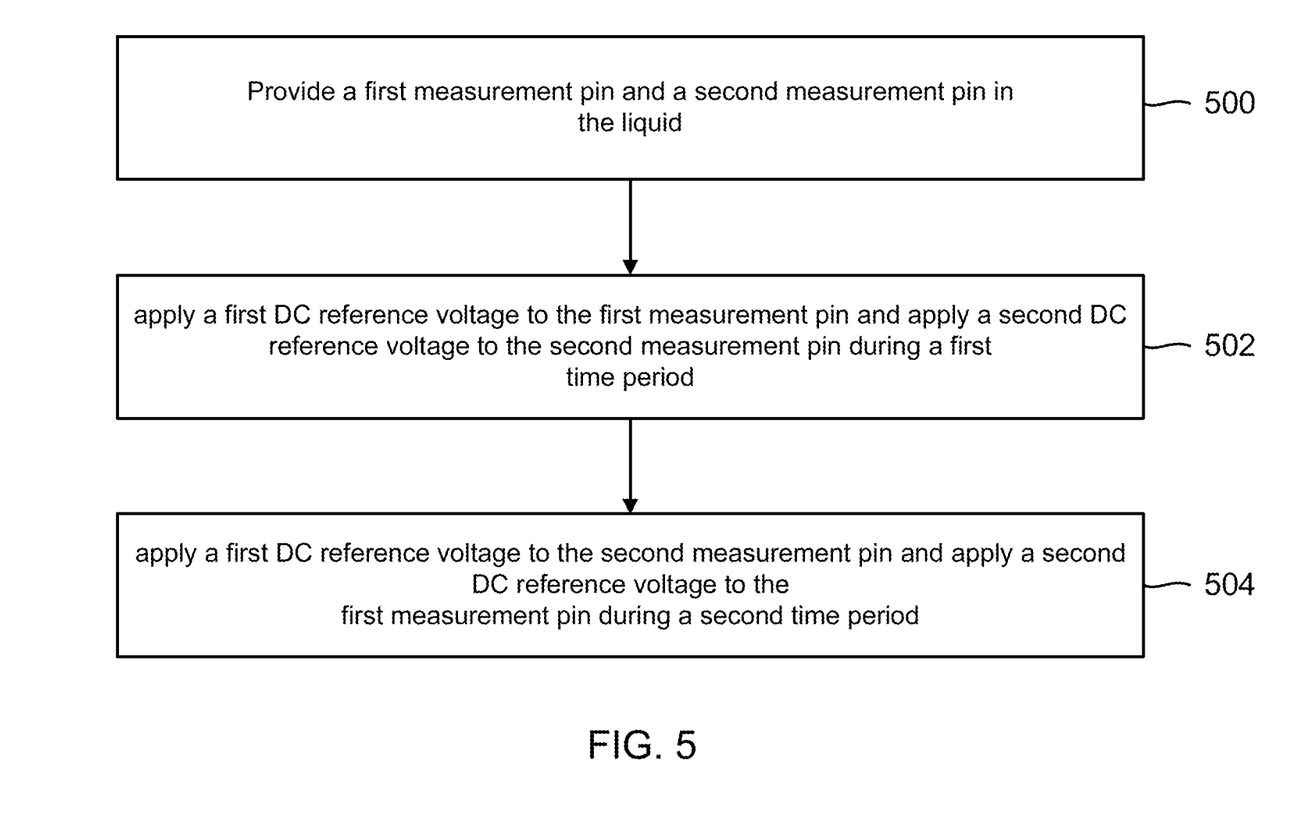
FIG. 5 is a flowchart of an embodiment of a method of measuring a conductivity of a liquid.

FIG. 5 is a circuit diagram of an embodiment of a method of measuring a conductivity of a liquid. In some embodiments, a first measurement pin and a second measurement pin are positioned in the liquid (procedure 500). A first DC reference voltage is applied to the first measurement pin and a second DC reference voltage is applied to the second measurement pin during a first time period (procedure 502). In some embodiments, procedure 502 includes operating a solid state switch device to selectively connect the first measurement pin to receive the first DC reference voltage from the DC measurement circuit, and operating the solid state switch device to selectively connect the second measurement pin to receive the second DC reference voltage.

Then, the first DC reference voltage is applied to the second measurement pin and a second DC reference voltage is applied to the first measurement pin during a second time period (procedure 504). In some embodiments, procedure 504 includes operating the solid state switch device to selectively connect the second measurement pin to receive the first DC reference voltage from the DC measurement circuit, and operating the solid state switch device to selectively connect the first measurement pin to receive the second DC reference voltage. By repeating procedures 502, 504, an AC voltage is applied across the first measurement pin and the second measurement pin with DC reference voltages.

Figure 6:
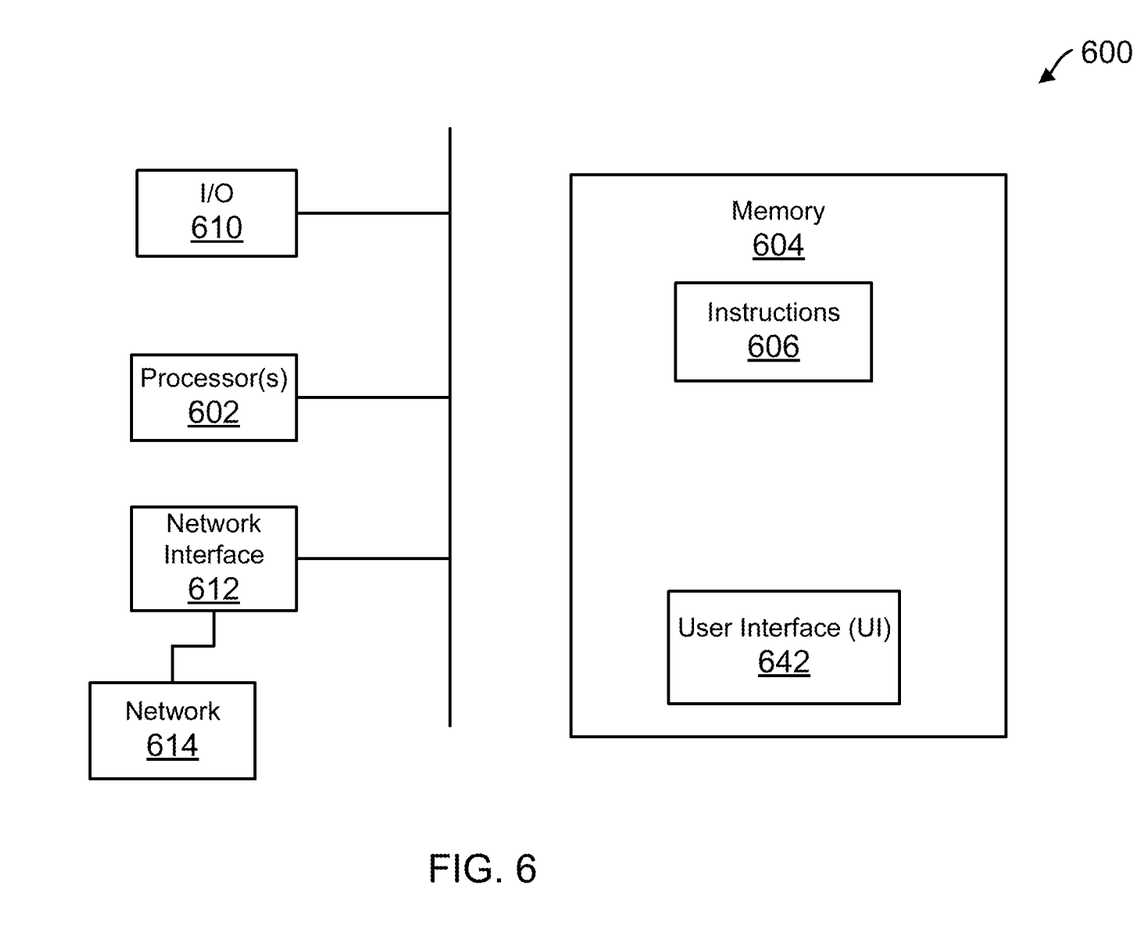
FIG. 6 is a high level block diagram of a processing system according to an embodiment.

FIG. 6 is a block diagram of a general purpose computing device 600 in accordance with some embodiments. The computing device 600 is configured to generate operate as described above with respect to the control circuitry 122 in FIG. 1 or the control circuitry 222 in FIG. 2. The general purpose computing device 600 also operates the solid state switch device so that the solid state switch device performs operations 502, 504.

In some embodiments, computing device 600 is a general purpose computing device including at least one hardware processor 602 and a non-transitory, computer-readable storage medium 604. Storage medium 604, amongst other things, is encoded with, i.e., stores, computer program code 606, i.e., a set of computer-executable instructions. Execution of instructions 606 by hardware processor 602 that implements a portion or all of the methods described herein in accordance with one or more embodiments (hereinafter, the noted processes and/or methods). Storage medium 604, amongst other things computer program code 606.

Processor 602 is electrically connected to computer-readable storage medium 604 via a bus 608. Processor 602 is also electrically connected to an I/O interface 610 by bus 608. A network interface 612 is also electrically connected to processor 602 via bus 608. Network interface 612 is connected to a network 614, so that processor 602 and computer-readable storage medium 604 are capable of connecting to external elements via network 614. Processor 602 is configured to execute computer program code 606 encoded in computer-readable storage medium 604 in order to cause system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program code 606 configured to cause computing device 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods.

Computing device 600 includes I/O interface 610. I/O interface 610 is connected to external circuitry. In one or more embodiments, I/O interface 610 includes a keyboard, keypad, mouse, trackball, trackpad, touchscreen, and/or cursor direction keys for communicating information and commands to processor 602.

Computing device 600 also includes network interface 612 connected to processor 602. Network interface 612 allows computing device 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 600.

Computing device 600 is configured to receive information through I/O interface 610. The information received through I/O interface 610 includes one or more of instructions, data, and/or other parameters for processing by processor 602. The information is transferred to processor 602 via bus 608. Computing device 600 is configured to receive information related to a UI through I/O interface 610. The information is stored in computer-readable medium 604 as user interface (UI) 642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, a portion or all of the noted processes and/or methods is implemented as a software application that is used by computing device 600.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, a conductivity measurement device for a liquid, includes a first conductivity probe comprising a first measurement pin and a second measurement pin and a first solid state switch device coupled to the first conductivity probe. The first solid state switch device is configured to selectively connect and disconnect the first measurement pin to a first DC reference voltage and a second DC reference voltage and selectively connect and disconnect the second measurement pin to the first DC reference voltage and the second DC reference voltage. Additionally, the conductivity measurement device further includes a DC measurement circuit configured to generate a measurement signal such that the measurement signal is maintained at a first DC reference voltage, wherein the DC measurement circuit is coupled to the first solid state switch device such that the first DC reference voltage is applied to the first solid state switch device from the DC measurement circuit.

In some embodiments, a method of measuring a conductivity of a liquid, includes providing a first measurement pin and a second measurement pin in the liquid, applying a first DC reference voltage to the first measurement pin and a second DC reference voltage to the second measurement pin during a first time period, and applying the first DC reference voltage to the second measurement pin and the second DC reference voltage to the first measurement pin during a second time period.

In some embodiments, a conductivity measurement device for a liquid, includes a first conductivity probe comprising a first measurement pin and a second measurement pin, a first solid state switch device coupled to the first conductivity probe, the first solid state switch device having a first switch terminal and a second switch terminal, and a DC circuit configured to generate a first DC reference voltage, wherein the DC circuit is coupled to the first solid state switch device such that the first DC reference voltage is applied to the first switch terminal of the first solid state switch device. The first solid state switch device is configured to selectively connect and disconnect the first measurement pin to the first switch terminal and the second switch terminal and selectively connect and disconnect the second measurement pin to the first switch terminal and the second switch terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A conductivity measurement device for a liquid, comprising:
    a first conductivity probe comprising a first measurement pin and a second measurement pin;
    a first solid state switch device coupled to the first conductivity probe, the first solid state switch device being configured to:
        selectively connect and disconnect the first measurement pin to a first DC reference voltage and a second DC reference voltage; and
        selectively connect and disconnect the second measurement pin to the first DC reference voltage and the second DC reference voltage; and
    a DC measurement circuit configured to generate a measurement signal such that the measurement signal is maintained at a first DC reference voltage, wherein the DC measurement circuit is coupled to the first solid state switch device such that the first DC reference voltage is applied to the first solid state switch device from the DC measurement circuit.

2. The conductivity measurement device of claim 1, wherein the first solid state switch device includes a first switch terminal connected to the DC measurement circuit to receive the first DC reference voltage, a second switch terminal of the first solid state switch device is configured to receive the second DC reference voltage that is lower than the first DC reference voltage.

3. The conductivity measurement device of claim 2, wherein the second DC reference voltage is a ground voltage.

4. The conductivity measurement device of claim 3, further comprising control circuitry connected to the first solid state switch device, wherein the control circuitry is configured to control the first solid state switch device to alternate selective connections between the first and second measurement pins and the first and second switch terminals to generate an AC voltage between the first and second measurement pins.

5. The conductivity measurement device of claim 1, wherein the DC measurement circuit comprises:
    a first operational amplifier having a first input terminal, a second input terminal, and a first output terminal wherein:
        the first input terminal is configured to receive the first DC reference voltage; and
        the first output terminal is connected as feedback to the second input terminal, such that the first operational amplifier is configured to generate the measurement signal by driving the second input terminal to the first DC reference voltage.

6. The conductivity measurement device of claim 5, wherein a first switch terminal of the first solid state switch device is connected to the second input terminal of the first operational amplifier.

7. The conductivity measurement device of claim 5, further comprising a first feedback resistor coupled as feedback between the first output terminal and the second input terminal of the first operational amplifier.

8. The conductivity measurement device of claim 5, further comprising a second operational amplifier having a third input terminal, a fourth input terminal, and a second output terminal, wherein:
    the third input terminal of the second operational amplifier is connected to the first output terminal of the first operational amplifier; and
    the second output terminal of the second operational amplifier is coupled as feedback to the fourth input terminal of the second operational amplifier.

9. The conductivity measurement device of claim 8, further comprising a resistor capacitor network connected to the second output terminal of the second operational amplifier.

10. The conductivity measurement device of claim 9, further comprising an analog to digital converter configured to compare the measurement signal to the first DC reference voltage so as to generate a digital conductivity measurement.

11. The conductivity measurement device of claim 1, further comprising resistors wherein:
    each of the resistors has a different value;
    the DC measurement circuit comprises:
        a first operational amplifier having a first input terminal, a second input terminal, and a first output terminal wherein:
            the first input terminal is configured to receive the first DC reference voltage;
            the first output terminal is connected to the first solid state switch device; and
            the second input terminal is connected to the first solid state switch device; and
    the first solid state switch device is further configured to selectively connect any one of the resistors as feedback between the first output terminal and the second input terminal of the first operational amplifier.

12. The conductivity measurement device of claim 1, further comprising
    a second conductivity probe comprising a third measurement pin and a fourth measurement pin;
    a second solid state switch device coupled to the second conductivity probe, wherein the second solid state switch device is configured to:
    selectively connect and disconnect the third measurement pin to the first DC reference voltage and the second DC reference voltage;
    selectively connect and disconnect the fourth measurement pin to the first DC reference voltage and the second DC reference voltage; and
    wherein the DC measurement circuit is coupled to the second solid state switch device such that the first DC reference voltage is applied to the second solid state switch device from the DC measurement circuit.

13. The conductivity measurement device of claim 12, further comprising
a third conductivity probe comprising a fifth measurement pin and a sixth measurement pin;
the second solid state switch device is coupled to the third conductivity probe, the second solid state switch device having a fifth switch terminal and a sixth switch terminal, wherein the second solid state switch device is configured to:
selectively connect and disconnect the fifth measurement pin to the fifth switch terminal and the sixth switch terminal;
selectively connect and disconnect the sixth measurement pin to the fifth switch terminal and the sixth switch terminal; and
wherein the DC measurement circuit is coupled to the second solid state switch device such that the first DC reference voltage is applied to the fifth switch terminal of the second solid state switch device.

14. The conductivity measurement device of claim 1, further comprising a reference voltage generation circuit configured to generate the first DC reference voltage from a power source voltage.

15. The conductivity measurement device of claim 1, further comprising a temperature measurement circuit configured to generate a second measurement signal that indicates a temperature of the liquid.

16. The conductivity measurement device of claim 1, further comprising control circuitry, wherein the control circuitry is configured to:
selectively connect the first measurement pin to a first switch terminal while selectively connecting the second measurement pin to a second switch terminal; and
selectively connect the second measurement pin to the first switch terminal while selectively connecting the first measurement pin to the second switch terminal.

17. The conductivity measurement device of claim 1, wherein when the first measurement pin is connected to the first DC reference voltage, the second measurement pin is connected to the second DC reference voltage, and when the first measurement pin is connected to the second DC reference voltage, the second measurement pin is connected to the first DC reference voltage.

18. A conductivity measurement device for a liquid, comprising:
a first conductivity probe comprising a first measurement pin and a second measurement pin;
a first solid state switch device coupled to the first conductivity probe, the first solid state switch device having a first switch terminal and a second switch terminal being configured to:
selectively connect and disconnect the first measurement pin to the first switch terminal and the second switch terminal;
selectively connect and disconnect the second measurement pin to the first switch terminal and the second switch terminal; and
a DC circuit configured to generate a first DC reference voltage, wherein the DC circuit is coupled to the first solid state switch device such that the first DC reference voltage is applied to the first switch terminal of the first solid state switch device.

* * * * *